United States Patent
Vimercati

(10) Patent No.: US 11,087,816 B2
(45) Date of Patent: Aug. 10, 2021

(54) CHARGE EXTRACTION FROM FERROELECTRIC MEMORY CELL

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/201,351

(22) Filed: Nov. 27, 2018

(65) Prior Publication Data
US 2019/0096467 A1    Mar. 28, 2019

Related U.S. Application Data

(62) Division of application No. 15/090,789, filed on Apr. 5, 2016, now Pat. No. 10,192,606.

(51) Int. Cl.
  *G11C 11/22* (2006.01)
(52) U.S. Cl.
  CPC ........ *G11C 11/2273* (2013.01); *G11C 11/221* (2013.01)
(58) Field of Classification Search
  CPC .............. G11C 11/2273; G11C 11/221; G11C 11/2255; G11C 11/225
  See application file for complete search history.

(56) References Cited

U.S. PATENT DOCUMENTS

| | | | |
|---|---|---|---|
| 5,487,030 A | 1/1996 | Drab et al. | |
| 6,188,601 B1 | 2/2001 | Kim et al. | |
| 6,459,609 B1 | 10/2002 | Du | |
| 6,657,840 B2 | 12/2003 | Yang et al. | |

(Continued)

FOREIGN PATENT DOCUMENTS

| | | |
|---|---|---|
| JP | 2002529876 A | 9/2002 |
| JP | 2005293818 A | 10/2005 |

(Continued)

OTHER PUBLICATIONS

ISA/KR, International Search Report and Written Opinion of the International Searching Authority, Int'l. Appl. No. PCT/US2017/023907, Jun. 26, 2017, Korean Intellectual Property Office, Seo-gu, Daejeon, Republic of Korea, 13 pgs.

(Continued)

*Primary Examiner* — Jerome Leboeuf
(74) *Attorney, Agent, or Firm* — Holland & Hart LLP

(57) ABSTRACT

A ferroelectric capacitor of a memory cell may be in electronic communication with a sense capacitor through a digit line. The digit line may be virtually grounded during memory cell sensing, limiting or avoiding voltage drop across the digit line, and allowing all or substantially all of the stored charge of the ferroelectric capacitor to be extracted and transferred to the sense capacitor. Virtually grounding the digit line may be achieved by activating a switching component (e.g., a p-type field-effect transistor) that is electronic communication with the digit line. The charge of the ferroelectric capacitor may be transferred through the switching component. A sense amplifier may compare the voltage of the sense capacitor to a reference voltage in order to determine the stored logic state of the memory cell.

20 Claims, 11 Drawing Sheets

(56) References Cited

U.S. PATENT DOCUMENTS

| | | |
|---|---|---|
| 6,819,601 B2 | 11/2004 | Eliason et al. |
| 6,856,535 B2 | 2/2005 | Madan |
| 6,859,383 B2 | 2/2005 | Baker |
| 7,460,390 B2 | 12/2008 | Yamamura |
| 7,869,252 B2 | 1/2011 | Koide |
| 8,130,580 B1 | 3/2012 | Devulapalli et al. |
| 8,213,253 B2 | 7/2012 | Fukushi |
| 8,531,862 B2 | 9/2013 | Roest et al. |
| 8,619,455 B2 | 12/2013 | Miyakawa et al. |
| 9,552,864 B1 | 1/2017 | Vimercati |
| 2002/0024836 A1 | 2/2002 | Braun et al. |
| 2002/0051376 A1* | 5/2002 | Yamamoto ............... G11C 11/22 365/145 |
| 2005/0128784 A1 | 6/2005 | Kawashima et al. |
| 2005/0195639 A1 | 9/2005 | Fukushi et al. |
| 2006/0067101 A1 | 3/2006 | Sakai |
| 2008/0304309 A1 | 12/2008 | Shiga et al. |
| 2009/0310397 A1 | 12/2009 | Koide |
| 2010/0128515 A1 | 5/2010 | Fukushi |
| 2012/0069623 A1 | 3/2012 | Miyakawa et al. |
| 2016/0343422 A1 | 11/2016 | Marotta et al. |

FOREIGN PATENT DOCUMENTS

| | | |
|---|---|---|
| JP | 2006190395 A | 7/2006 |
| JP | 2008059676 A | 3/2008 |
| JP | 2008305469 A | 12/2008 |
| JP | 2019511804 A | 4/2019 |
| WO | 0026919 A1 | 5/2000 |
| WO | 2004093088 A1 | 10/2004 |
| WO | 2009034603 A1 | 3/2009 |
| WO | 2017156444 A1 | 9/2017 |

OTHER PUBLICATIONS

Kawashima, et al., "Bitline GND Sensing Technique for Low-Voltage Operation FeRAM", IEEE Journal of Solid-State Circuits,, May 2002, 592-598, vol. 37, No. 5, IEEE.

European Patent Office, "European Search Report," issued in connection with European Patent Application No. 17779519.2, dated Nov. 8, 2019 (11 pages).

Bakshi, V.U., Elements of Electrical Engineering, Technical Publications Pune, 2010, pp. 33-35.

The Korean Intellectual Property Office, "Notice of Reasons for Rejection," issued in connection with Korean Patent Application No. 10-2018-7031651, dated Mar. 20, 2020 (4 pages).

JPO, "Notice of Rejection Ground," issued in connection with Japan Patent Application No. 2018-551984, dated Feb. 4, 2020 (13 pages).

* cited by examiner

CHARGE EXTRACTION FROM FERROELECTRIC MEMORY CELL

CROSS REFERENCE

The present Application for Patent is a divisional of U.S. patent application Ser. No. 15/090,789, by Vimercati, entitled "Charge Extraction From Ferroelectric Memory Cell," filed Apr. 5, 2016, assigned to the assignee hereof, and is expressly incorporated by reference in its entirety herein.

BACKGROUND

The following relates generally to memory devices and more specifically to charge extraction from ferroelectric memory cells.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Multiple types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may become discharged over time through leakage currents, resulting in the loss of the stored information. Certain aspects of volatile memory may offer performance advantages, such as faster read or write speeds, while aspects of non-volatile, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. Some FeRAM sensing schemes may, however, extract only a fraction of the ferroelectric capacitor's stored charge when determining the stored logic state. This may reduce the reliability of sensing operations or may limit memory cell (or array) size reductions that could otherwise be made.

BRIEF DESCRIPTION OF THE DRAWINGS

Embodiments of the disclosure are described with reference to the following figures.

DETAILED DESCRIPTION

Figure 1:
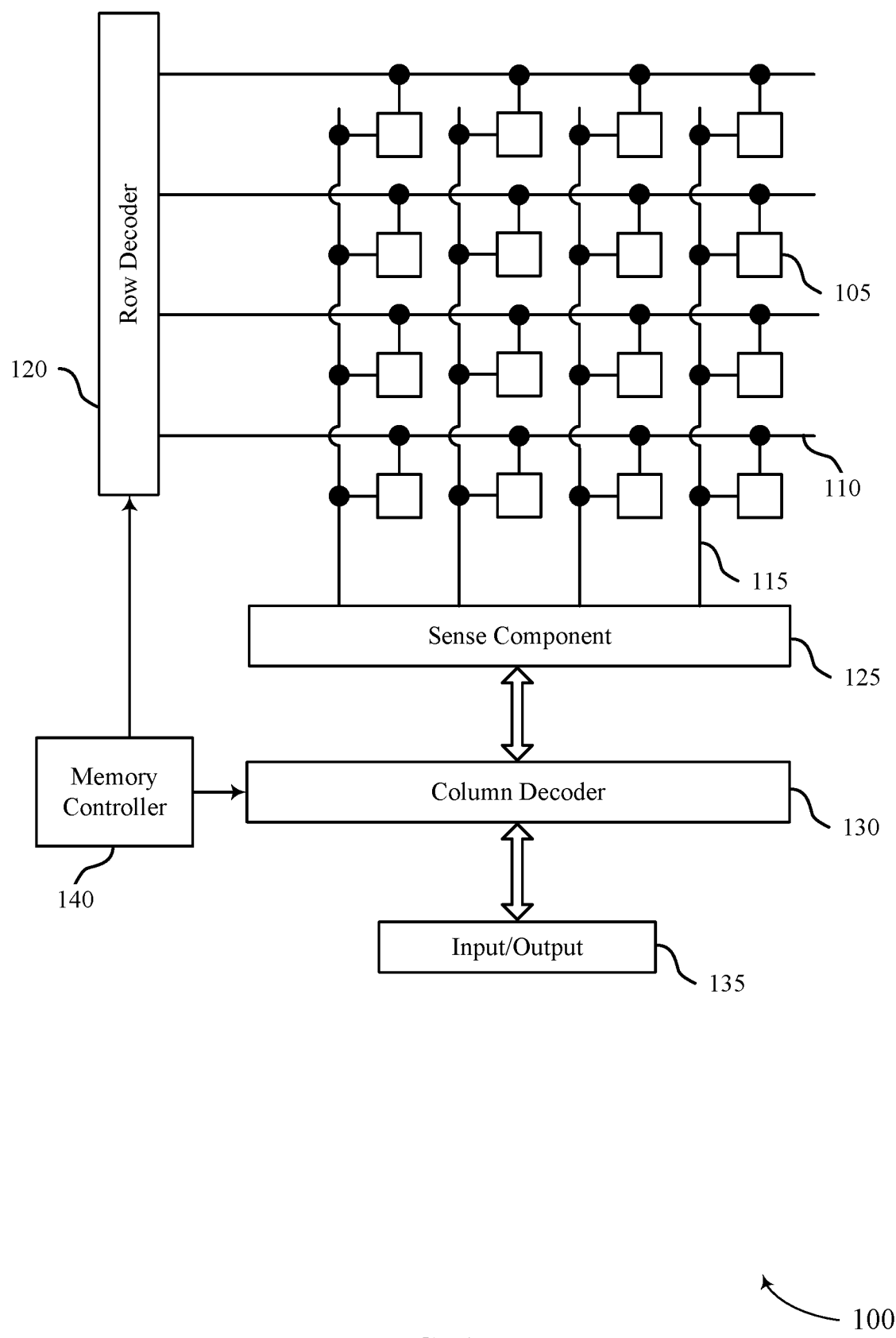
FIG. 1 illustrates an example memory array that supports charge extraction from ferroelectric memory cells in accordance with various embodiments of the present disclosure.

Increased sensing reliability for memory cells may be realized with a sensing scheme that allows a full or substantially full charge of a ferroelectric capacitor of the memory cell to be extracted. Memory cells, including FeRAM cells, within a memory array are often accessed by a word line and a digit line. A single digit line may connect many memory cells and may be connected to a sense amplifier that, when activated, may determine the stored logic state of a memory cell. To facilitate full charge extraction, a digit line of a memory array may be grounded during a read operation and the full charge of a ferroelectric capacitor may be shared with a sense capacitor—i.e., a capacitor used for a sense or read operation. The voltage of the sense capacitor may then be compared with a reference voltage.

This is in contrast to other FeRAM sensing schemes that rely on or are subject to the intrinsic capacitance of the digit line to sense which state was stored in the memory cell. In schemes that rely on a digit line for sensing, when the memory cell is accessed, charge sharing between the memory cell and the digit line may cause a voltage to develop on the digit line. The amount of charge transferred to the digit line, and thus final digit line voltage, may depend on the stored logic state of the memory cell. The voltage of the digit line may effectively reduce the voltage of the ferroelectric capacitor during a read operation. So this type of sensing scheme may be sensitive to the physical characteristics of the memory cell, such as the coercive voltage of the ferroelectric capacitor. A higher coercive voltage value of the ferroelectric capacitor may thus result in a reduced sense window—i.e., a smaller difference in voltage for a logic 1 or logic 0—and thus reduced accuracy in a read operation.

As disclosed herein, a sensing scheme that prevents the digit line from developing a non-zero voltage during read operations allows all or substantially all stored charge to be extracted from the ferroelectric memory cell. This may increase the sense window because the increase in extracted charge may, as described below, result in a higher signal for the sense amplifier.

A sensing scheme that maintains a digit line at approximately zero volts during a read operation may also enable further reduction in memory cell size. By way of example, a size of a ferroelectric capacitor of a memory cell may be proportional to a charge stored in that capacitor. Sensing schemes that allow a full charge to be extracted from a relatively smaller capacitor may provide comparably reliable results to schemes in which a fractional charge is extracted from a larger capacitor. In other words, a full-extraction sensing scheme may provide reliable results without the charge necessary to obtain similar results from a fraction-extraction scheme and may thus support memory cell size reduction with little or no compromise to reliability.

As described below, the digit line may be virtually grounded using an active switching component, for example, a p-type field-effect transistor (FET) in electronic communication with the digit line. When the memory cell is selected, charge may flow to a sense capacitor. Due to the virtual grounding by the p-type FET, all charge may flow to the sense capacitor. A sense amplifier may then compare the voltage of the sense capacitor to a reference voltage in order to determine the stored logic state. The voltage of the sense capacitor may be larger than the voltage of the digit line used in previous sensing schemes.

In an example described below, the active switching component (e.g., a FET) may be connected in series with the digit line and positioned between the memory cell and the sense capacitor. In such cases, a negative voltage may be applied to activate the switching component. In another example described below, the active switching component may be in electronic communication with the digit line at a point between the memory cell and the sense capacitor. In such cases, another capacitor may be connected in parallel to the active switching component, which may enable a positive voltage to activate the active switching component and thus obviate the need to apply a negative voltage to the memory array.

Embodiments of the disclosure introduced above are further described below in the context of a memory array. Specific examples are then described for circuits that support virtually grounding the digit line during memory sensing to extract the stored charge of a memory cell. Example timing plots of the circuit operation are also presented. These and other embodiments of the disclosure are further illustrated by and described with reference to apparatus diagrams, system diagrams, and flowcharts that relate to charge extraction from ferroelectric memory cells.

FIG. 1 illustrates an example memory array 100 that supports charge extraction from ferroelectric memory cells in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted a logic 0 and a logic 1. In some cases, memory cell 105 is configured to store more than two logic states. A memory cell 105 may include a capacitor to store a charge representative of the programmable states; for example, a charged and uncharged capacitor may represent two logic states. DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties, and some details and advantages of a ferroelectric memory cell 105 are discussed below.

Operations such as reading and writing may be performed on memory cells 105 by activating or selecting the appropriate word line 110 and digit line 115. Activating or selecting a word line 110 or a digit line 115 may include applying a voltage to the respective line. In some cases, a digit line 115 may be referred to as a bit line. Word lines 110 and digit lines 115 may be made of conductive materials. In some examples, word lines 110 and digit lines 115 are made of metals (e.g., copper, aluminum, gold, tungsten, etc.). Each row of memory cells 105 are connected to a single word line 110, and each column of memory cells 105 are connected to a single digit line 115. By activating one word line 110 and one digit line 115, a single memory cell 105 may be accessed at their intersection. The intersection of a word line 110 and digit line 115 may be referred to as an address of a memory cell.

In some architectures, the logic storing device of a cell, e.g., a capacitor, may be electrically isolated from the digit line by a selection device. The word line 110 may be connected to and may control the selection device. For example, the selection device may be a transistor and the word line 110 may be connected to the gate of the transistor. Activating the word line 110 results in an electrical connection between the capacitor of a memory cell 105 and its corresponding digit line 115. The digit line may then be accessed to either read or write the memory cell 105.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. Thus, by activating a word line 110 and a digit line 115, a memory cell 105 may be accessed.

Upon accessing, a memory cell 105 may be read, or sensed, by sense component 125. For example, sense component 125 may compare a signal, e.g., a voltage, of the relevant digit line 115 to a reference signal (not shown) in order to determine the stored state of the memory cell 105. For example, if digit line 115 has a higher voltage than the reference voltage, then sense component 125 may determine that the stored state in memory cell 105 was a logic 1 and vice versa. In some cases, the digit line 115 may virtually grounded during sensing, which may allow stored charge of memory cell 105 to be transferred to another device (e.g., a sense capacitor, not shown) via the digit line 115. This may allow a full charge or substantially full charge of the memory cell 105 to be used for reading memory cell 105. Sense component 125 may include various transistors or amplifiers in order to detect and amplify a difference in the signals, which may be referred to as latching. Sense component 125 may also include a sense capacitor as described with reference to FIGS. 4 and 5. The detected logic state of memory cell 105 may be output through column decoder 130 as output 135.

A memory cell 105 may be set, or written, by similarly activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. In the case of a ferroelectric capacitor, a memory cell 105 is written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high—e.g., tens of refresh operations per second may be employed for DRAM—which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery.

Ferroelectric memory cells may, however, have beneficial properties that may result in improved performance relative to other memory architectures. For example, because ferroelectric memory cells tend to be less susceptible to degradation of stored charge, a memory array 100 that employs ferroelectric memory cells 105 may require fewer or no refresh operations, and may thus require less power to operate. Additionally, employing sensing schemes described herein in which all or substantially all stored charge in a memory cell is extracted may enable the memory cell 105 size to be reduced, which may allow for reduced power consumption relative to other arrays employing other sensing schemes.

The memory controller 140 may control the operation (e.g., read, write, re-write, refresh, etc.) of memory cells 105 through the various components, for example, row decoder 120, column decoder 130, and sense component 125. Memory controller 140 may generate row and column address signals in order to activate the desired word line 110 and digit line 115. Memory controller 140 may also generate and control various voltages used during the operation of memory array 100. For example, memory controller 140 may operate a switching component to virtually ground a digit line 115 during sensing. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

As described herein, a ferroelectric memory cell 105 that is in electronic communication with a digit line 115 may be selected. The digit line 115 may be virtually grounded. In some cases, the digit line 115 may be virtually grounded by activating a switching component that is in electronic communication between the digit line and the sense component 125 (e.g., a sense amplifier of sense component 125). A voltage may be applied to a ferroelectric capacitor of the ferroelectric memory cell 105. This may result in the charging of a sense capacitor that is in electronic communication with the digit line 115. The charging may be based on applying the voltage to the ferroelectric capacitor while the digit line is virtually grounded. In some cases, all charge may be extracted from the ferroelectric capacitor of ferroelectric memory cell 105. A sense amplifier, which may be an aspect of sense component 125, that is in electronic communication with the digit line 115 may be activated based on virtually grounding the digit line 115. In some cases, the sense component 125 may be activated while the digit line 115 is virtually grounded. The sense amplifier may compare a voltage of the sense capacitor, which may be an aspect of sense component 125, to a reference voltage based on being activated.

Figure 2:
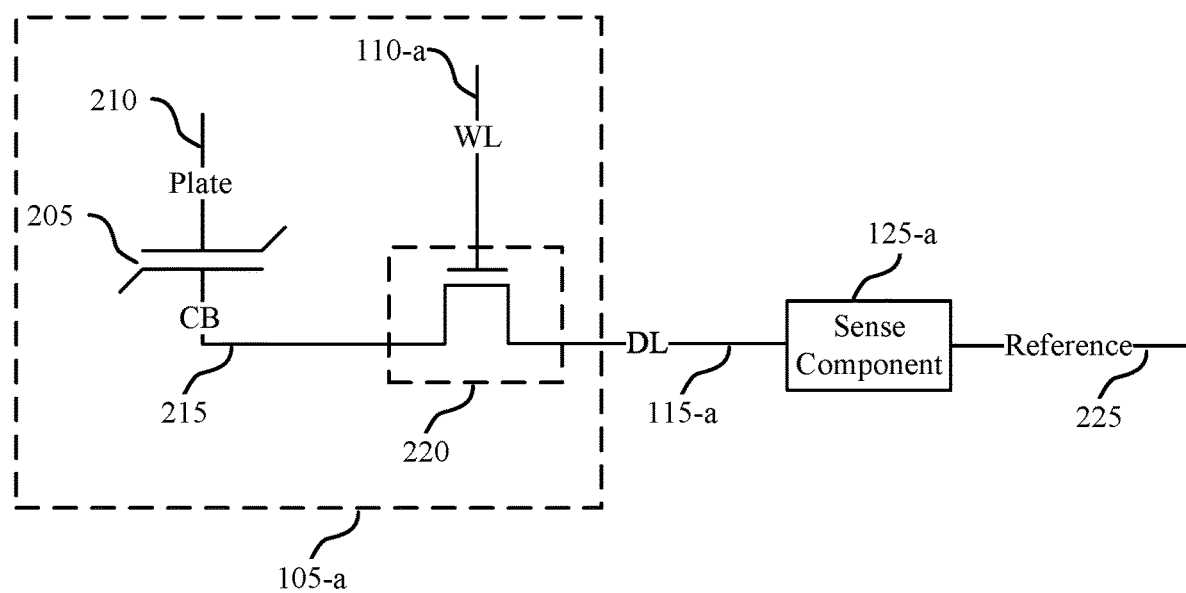
FIG. 2 illustrates an example circuit that supports charge extraction from ferroelectric memory cells in accordance with various embodiments of the present disclosure.

FIG. 2 illustrates an example circuit 200 that supports charge extraction from ferroelectric memory cells in accordance with various embodiments of the present disclosure. Circuit 200 may include a ferroelectric memory cell 105-a, word line 110-a, digit line 115-a, and sense component 125-a, which may be examples of a memory cell 105, word line 110, digit line 115, and sense component 125, respectively, as described with reference to FIG. 1. Circuit 200 may include a reference component 225 and a logic storage component, such as capacitor 205, which may include conductive terminals, including plate 210 and cell bottom 215. These terminals may be separated by an insulating ferroelectric material. As described above, various states may be stored by charging or discharging capacitor 205, i.e., polarizing the ferroelectric material of capacitor 205.

The stored state of capacitor 205 may be read or sensed by operating various elements represented in circuit 200. Capacitor 205 may be in electronic communication with digit line 115-a. Capacitor 205 may thus be isolated from the digit line 115-a when selection component 220 is deactivated, and capacitor 205 may be connected to digit line 115-a via selection component 220 when selection component 220 is activated to select the ferroelectric memory cell 105-a. In other words, ferroelectric memory cell 105-a may be selected using selection component 220 that is in electronic communication with ferroelectric capacitor 205, where ferroelectric memory cell 105-a includes selection component 220 and ferroelectric capacitor 205. In some cases, selection component 220 may be a transistor and its operation may be controlled by applying a voltage to the transistor gate, where the applied voltage has a magnitude that is approximately equal to or greater than the threshold magnitude of the transistor. Word line 110-a may activate selection component 220; for example, a voltage may be applied to the transistor gate through word line 110-a.

In the example depicted in FIG. 2, capacitor 205 may be a ferroelectric capacitor. Due to the ferroelectric material between the plates of capacitor 205, and as discussed in more detail below, capacitor 205 may not discharge upon connection to digit line 115-a. Instead, plate 210 may be biased by an external voltage, resulting in a change in the stored charge on capacitor 205. The change in stored charge corresponds to a logic state of capacitor 205. A voltage applied to capacitor 205 changes the charge of capacitor

205. The change in stored charge may be compared to a reference by sense component 125-a in order to determine the stored logic state in memory cell 105-a.

The specific sensing scheme or process may take many forms. In one example, digit line 115-a may have an intrinsic capacitance and develop a non-zero voltage as capacitor 205 charges or discharges in response to the voltage applied to plate 210. The intrinsic capacitance may depend on physical characteristics, including the dimensions of digit line 115-a. Digit line 115-a may connect many memory cells 105 so digit line 115-a may have a length that results in a non-negligible capacitance (e.g., on the order of pF). The subsequent voltage of digit line 115-a may depend on the initial logic state of capacitor 205, and sense component 125-a may compare this voltage to a reference voltage provided by reference component 225. For example, a voltage may be applied to plate 210 and a voltage at cell bottom 215 may change in relation to the stored charge. The voltage at cell bottom 215 may be compared with a reference voltage at sense component 125-a, and a comparison to the reference voltage may indicate a change in the charge of capacitor 205 resulting from the applied voltage and thus indicate a logic state stored in memory cell 105-a. The relationship between charge and voltage in capacitor 205 is described in further detail with reference to FIG. 3.

Other sensing processes may be used, such as virtually grounding the digit line using an active switching component (not shown) during sensing. For example, a switching component that is in electronic communication with digit line 115-a may be activated to virtually ground digit line 115-a. When the switching component is activated, a voltage may be applied to ferroelectric capacitor 205 based on selecting ferroelectric memory cell 105-a. This may result in charging a sense capacitor, which may be contained in sense component 125-a, that is in electronic communication with ferroelectric memory cell 105-a while digit line 115-a is virtually grounded. In some cases, the charging is based on a voltage applied to ferroelectric capacitor 205 of memory cell 105-a, which may result in transferring a stored charge of ferroelectric memory cell 105-a to the sense capacitor through the switching component.

To sense the stored state, a voltage of the sense capacitor may be compared to a reference voltage. In some cases, comparing the voltage of the sense capacitor to the reference voltage includes activating a sense amplifier that is in electronic communication with the sense capacitor. In some cases, the sense amplifier is part of sense component 125-a. The reference voltage may result from charging a reference capacitor that is in electronic communication with the sense amplifier, and the sense amplifier may compare the voltage of the sense capacitor to the voltage of the reference capacitor.

To write memory cell 105-a, a voltage may be applied to capacitor 205. Various methods may be used. In one example, selection component 220 may be activated through word line 110-a in order to electrically connect capacitor 205 to digit line 115-a. A voltage may be applied to capacitor 205 by controlling the voltage of plate 210 and cell bottom 215 through digit line 115-a. To write a logic 0, plate 210 may be taken high, that is, a positive voltage may be applied, and cell bottom 215 may be taken low, i.e., connected to ground, virtually grounded, or a negative voltage may be applied. The opposite process is performed to write a logic 1, and plate 210 is taken low and cell bottom 215 is taken high.

Figure 3:
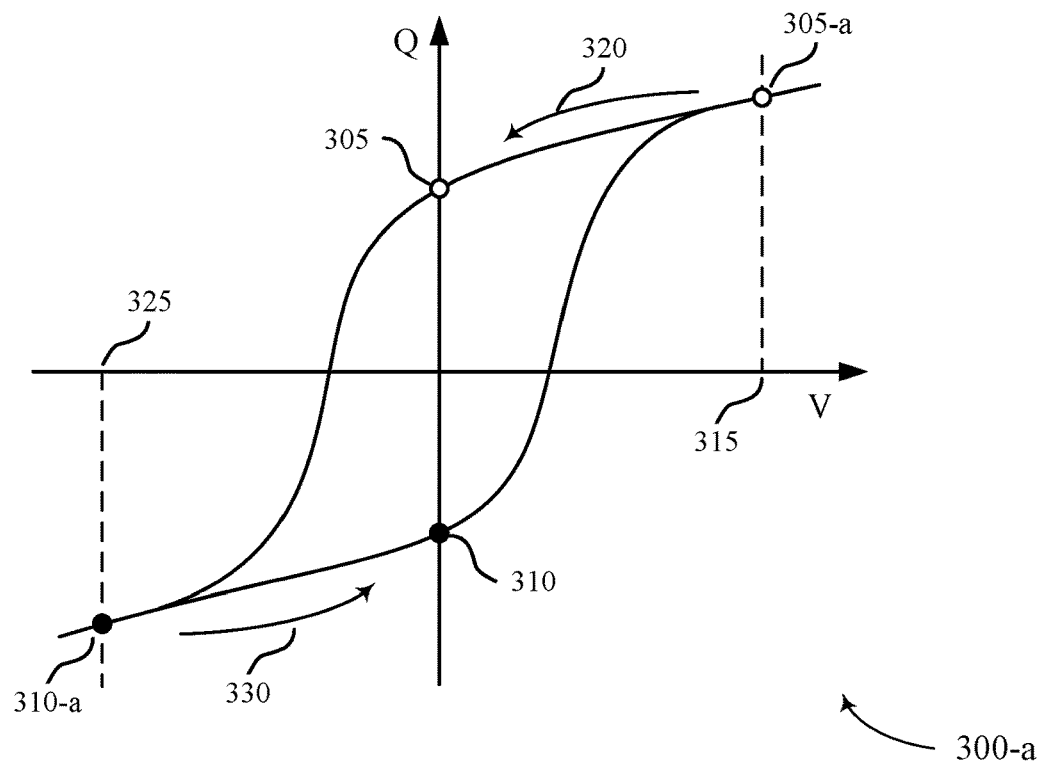
FIG. 3 illustrates example hysteresis curves for a ferroelectric memory cell that supports charge extraction in accordance with various embodiments of the present disclosure.
Figure 3:
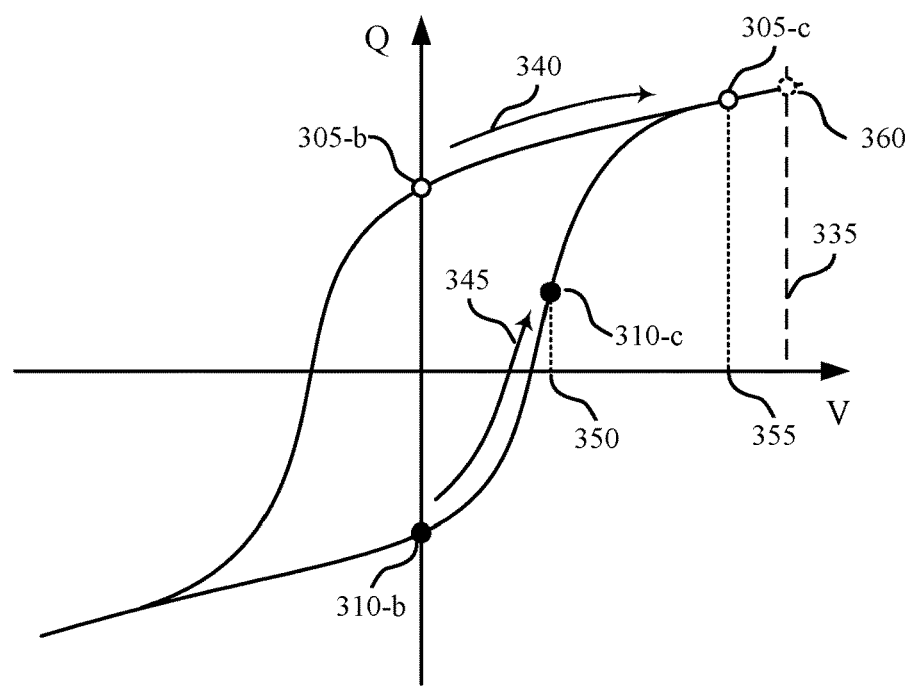

The non-linear properties associated with a ferroelectric device may account for read and write operations of capacitor 205. FIG. 3 illustrates examples of such non-linear properties with hysteresis curves 300. Hysteresis curves 300-a and 300-b illustrate an example ferroelectric memory cell writing and reading process, respectively, in a ferroelectric memory cell that supports charge extraction in accordance with various embodiments of the present disclosure. Hysteresis curves 300 depict the charge, Q, stored on a ferroelectric capacitor (e.g., capacitors 205 of FIGS. 2, 4, and 5) as a function of a voltage, V.

A ferroelectric material is characterized by a spontaneous electric polarization—i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described, including capacitor s 205 described with reference to FIGS. 2, 4, and 5, may include these or other ferroelectric materials. Electric polarization within a ferroelectric capacitor results in a net charge at the ferroelectric material's surface and attracts opposite charge through the capacitor terminals. Thus, charge may be stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations, as described above.

Hysteresis curves 300 may be understood from the perspective of a single terminal of a capacitor. By way of example, if the ferroelectric material has a negative polarization, positive charge may accumulate at the terminal. Likewise, if the ferroelectric material has a positive polarization, negative charge may accumulate at the terminal. Additionally, the voltages in hysteresis curves 300 represent a voltage difference across the capacitor and are directional. For example, a positive voltage may be applied by applying a positive voltage to the terminal in question and maintaining the second terminal at ground (or approximately zero volts (0V)). A negative voltage may be applied by maintaining the terminal in question at ground (or 0V) and applying a positive voltage to the second terminal—i.e., positive voltages may be applied to negatively polarize the terminal in question. Similarly, two positive voltages, two negative voltages, or a combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage. Similarly, charge state 310 is written by applying a net negative voltage 325, which results in charge state 310-*a*. After removing negative voltage 325, charge state 310-*a* follows path 330 until it reaches charge state 310 at zero voltage. Charge states 305-*a* and 310-*a* may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge changes, and the degree of the change depends on the initial charge state—i.e., the degree to which the stored charge of the capacitor changes is variable and depends on whether charge state 305-*b* or 310-*b* was initially stored. For example, hysteresis curve 300-*b* illustrates two possible stored charge states 305-*b* and 310-*b*. Net voltage 335 may be applied across the capacitor. Although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on a number of factors, including the specific sensing operation and circuitry.

In some cases, the charge sensed during a read operation may depend on the intrinsic capacitance of the digit line of a memory cell. For example, if a ferroelectric capacitor of the memory cell is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-*c* and 310-*c* on hysteresis curve 300-*b* may thus depend on the capacitance of the digit line and may be determined through a load-line analysis, i.e., charge states 305-*c* and 310-*c* may be defined with respect to the digit line capacitance. As a result, the voltage of the capacitor, voltage 350 or voltage 355, may be different and may depend on the initial state of the capacitor.

When a digit line is used for a read operation—e.g., when a digit line is not virtually grounded—then the resulting voltage of the digit line may be the difference between voltage 335 and voltage 350, or the difference between voltage 335 and voltage 355 depending on the stored logic state. By comparing the digit line voltage to a reference voltage, the initial state of the capacitor may be determined. For example, the reference voltage may be an average of the digit line logic 0 and logic 1 voltages, e.g., [(voltage 335−voltage 350)+(voltage 335−355)]/2. Upon comparison, the sensed digit line voltage may be determined to be higher or lower than the reference voltage. A value of the ferroelectric cell (i.e., a logic 0 or 1) may then be determined based on the comparison. But as discussed herein, this approach may not allow a full charge of the capacitor to be extracted.

Accordingly, a sensing scheme in which the digit line is maintained at 0V may be employed, and the final positions of charge states 305-*c* and 310-*c* may be independent of the digit line capacitance. For example, the digit line may be virtually grounded during sensing by the activation of a switching component. In such cases, charge states 305-*c* and 310-*c* may be co-located at charge state 360. Here, all or substantially all charge may be extracted from the ferroelectric memory cell, which is illustrated by the difference in charge states 360 and 310-*b* being greater than the difference between charge states 310-*c* and 310-*b*. This charge may be stored on a sense capacitor, and the voltage of the sense capacitor may then be used to determine the stored state of the memory cell. This may result in a higher signal developed at the sense amplifier. Alternatively, a similar sensing scheme may be employed with a smaller memory cell with little or no difference in results. This may increase scaling capability of memory cells and memory arrays, for example.

As discussed above, reading a DRAM memory cell may degrade or destroy the stored logic. A ferroelectric memory cell, however, may maintain the initial logic state after a read operation. For example, if charge state 305-*b* is stored and the read operation performed, the charge state may return to initial charge state 305-*b* after voltage 335 is removed, for example, by following path 340 in the opposite direction.

Figure 4:
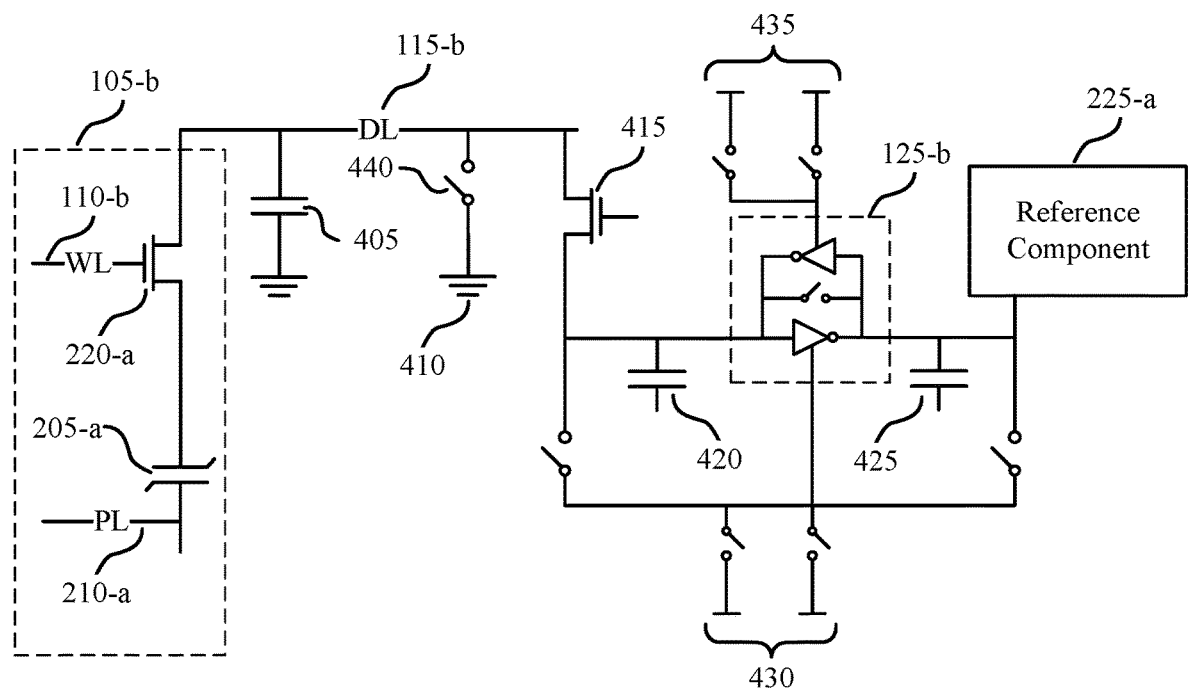
FIG. 4 illustrates an example circuit that supports charge extraction from ferroelectric memory cells in accordance with various embodiments of the present disclosure.

FIG. 4 illustrates an example circuit 400 that supports charge extraction from ferroelectric memory cells in accordance with various embodiments of the present disclosure. Circuit 400 may include memory cell 105-*b*, word line 110-*b*, digit line 115-*b*, and sense component 125-*b*, which may be examples of a memory cell 105, word line 110, digit line 115, and sense component 125, respectively, as described with reference to FIGS. 1 and 2. Circuit 400 may also include capacitor 205-*a*, plate 210-*a*, and reference component 225-*a*, which may be examples of capacitor 205, plate 210, and reference component 225, respectively, as described with reference to FIG. 2. Additionally, according to the example of FIG. 4, digit line 115-*b* includes intrinsic digit line capacitance 405, and digit line 115-*b* is capable of being connected to virtual ground 410 via switching component 440. Circuit 400 also includes sense capacitor 420, reference capacitor 425, voltage source(s) 430, and voltage source(s) 435. In some cases, switching component 415 may virtually ground the digit line, enabling full or substantially full charge transfer from capacitor 205-*a* to sense capacitor 420 during sensing of memory cell 105-*b*.

Digit line 115-*b* may have an intrinsic capacitance, which is represented by intrinsic digit line capacitance 405. Intrinsic digit line capacitance 405 may not be an electrical device—e.g., it may not be a two-terminal capacitor. Instead, intrinsic digit line capacitance 405 may depend on physical characteristics, including the dimensions, of digit line 115-*b*. The capacitance of sense capacitor 420 may be greater than intrinsic digit line capacitance 405, which may facilitate charge transfer to sense capacitor 420.

Virtual ground 410 may provide a virtual ground to digit line 115-*b* through switch 440. For example, virtual ground 410 may be in electronic communication with digit line 115-*b* through switch 440. In some cases, switch 440 may be a transistor. In some cases, digit line 115-*b* is virtually grounded before a sensing operation of memory cell 105-*b* begins. Switch 440 may then be deactivated to isolate digit line 115-*b* from virtual ground 410.

Switching component 415 may be a transistor connected in series with the sense capacitor 420 and selection component 220-*a*. That is, switching component 415 may be connected in series with digit line 115-*b*. In some cases, the transistor comprises a p-type FET. Sense capacitor 420 and reference capacitor 425 may be capacitors configured to store charge when memory cell 105-*b* is sensed. In some cases, sense capacitor 420 and reference capacitor 425 may have the same capacitance—e.g., sense capacitor 420 and reference capacitor 425 may have a common value or rating measured in farads.

Reference capacitor 425 may be in electronic communication with reference component 225-*a*. In some cases, reference component 225-*a* is one or more ferroelectric memory cells 105. Reference component 225-*a* may be configured to generate or produce a reference signal. In some cases, charge produced by reference component 225-*a* is stored on reference capacitor 425.

Sense component 125-*b* may determine the stored state of memory cell 105-*b*. In some cases, sense component 125-*b* may be or may include a sense amplifier. Sense component 125-*b* may be operated by voltage source(s) 430 and 435. Sense component 125-*b* may also include sense capacitor 420 or reference capacitor 425, although not depicted this way in the example of FIG. 4. Sense component 125-*b* may also be in electronic communication with selection component 220-*a* through digit line 115-*b*.

A charging voltage may be applied by voltage source(s) 430 or 435 to sense capacitor 420 while switching component 415 is inactive, i.e., while digit line 115-*b* is electrically isolated from sense capacitor 420. In some cases, the charging voltage applied to sense capacitor 420 may be negative. Sense capacitor 420 may then be electrically isolated from voltage source(s) 430 or 435.

As depicted, ferroelectric memory cell 105-*b* is in electronic communication with digit line 115-*b*. Switching component 415 that is also in electronic communication with digit line 115-*b* may be activated to virtually ground digit line 115-*b*. In some cases, deactivating switching component 415 isolates digit line 115-*b* from the virtual grounding. In some examples, switching component 415 may be a p-type FET. Activating switching component 415 to virtually ground digit line 115-*b* may include applying a gate voltage to the gate of the transistor; the gate voltage may be negative and have a magnitude approximately equal to or greater than a threshold voltage magnitude of the transistor. In some cases, virtual ground 410 may virtually ground digit line 115-*b* through switch 440 before switching component 415 is activated or before ferroelectric memory cell 105-*b* is selected.

Ferroelectric memory cell 105-*b* may be selected using selection component 220-*a* that is in electronic communication with ferroelectric capacitor 205-*a*, where ferroelectric memory cell 105-*b* includes the selection component 220-*a* and ferroelectric capacitor 205-*a*. For example, selection component 220-*a* may be a transistor (e.g., FET) and may be activated by applying a voltage to a gate of a transistor through word line 110-*b*.

When switching component 415 is activated, a voltage may be applied to ferroelectric capacitor 205-*a* based on selecting ferroelectric memory cell 105-*b*. For example, a voltage may be applied using plate 210-*a*. This may result in charging sense capacitor 420 that is in electronic communication with ferroelectric memory cell 105-*b* while digit line 115-*b* is virtually grounded. The charging may thus be based on a voltage applied to ferroelectric capacitor 205-*a* of memory cell 105-*b* and result in transferring a stored charge of ferroelectric memory cell 105-*b* to sense capacitor 420 through switching component 415.

A voltage of sense capacitor 420 may be compared to a reference voltage. In some cases, comparing the voltage of sense capacitor 420 to the reference voltage includes activating sense component 125-*b* that is in electronic communication with sense capacitor 420. In some cases, sense component 125-*b* is or includes a sense amplifier. The reference voltage may result from charging reference capacitor 425 that is in electronic communication with sense component 125-*b*, and sense component 125-*b* may compare the voltage of sense capacitor 420 to the voltage of reference capacitor 425.

Figure 5:
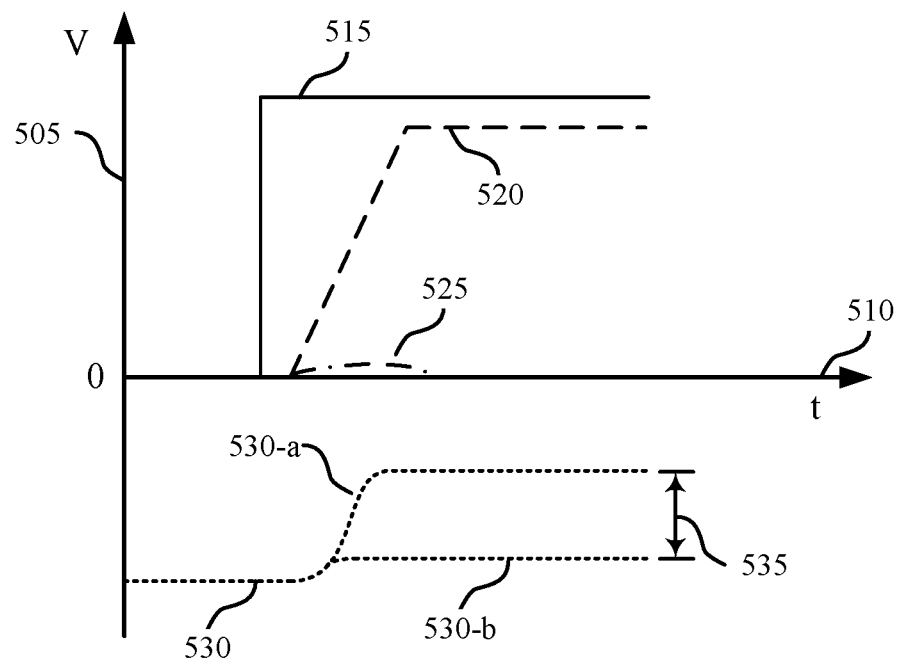
FIG. 5 illustrates a timing diagram for operating a ferroelectric memory cell that supports charge extraction in accordance with various embodiments of the present disclosure.

FIG. 5 illustrates a timing diagram 500 for operating a ferroelectric memory cell that supports charge extraction in accordance with various embodiments of the present disclosure. Timing diagram 500 depicts voltage on axis 505 and time on axis 510. The voltage of various components as a function of time may thus be represented on timing diagram 500. For example, timing diagram 500 includes word line voltage 515, plate voltage 520, digit line voltage 525, and sense capacitor voltage 530. Timing diagram 500 depicts an example operation of circuit 400 described with reference to FIG. 4. FIG. 5 is described below with reference to components of preceding figures.

As discussed in FIG. 4, the sense capacitor 420 may be charged initially to a negative voltage, as depicted by sense capacitor voltage 530. Word line voltage 515 may be applied to a word line 110 associated with a ferroelectric memory cell 105. Plate voltage 520 may be applied to a plate 210 of the ferroelectric memory cell 105. Digit line voltage 525 may be approximately zero, or virtually grounded, during sensing as discussed previously. For example, a switching component 415 may virtually ground the digit line during sensing. In some cases, the digit line voltage 525 may deviate slightly from zero.

With digit line voltage 525 at approximately 0V while word line voltage 515 and plate voltage 520 are applied, charge may transfer to a sense capacitor 420, resulting in a change in sense capacitor voltage 530. For example, sense capacitor voltage 530 may increase. The change in sense capacitor voltage 530 may depend on the logic state of the memory cell 105. For example, if a logic 0 is stored, sense capacitor voltage 530 may change to sense capacitor voltage 530-*a*. If a logic 1 is stored, sense capacitor voltage 530 may change to sense capacitor voltage 530-*b*. The difference between sense capacitor voltage 530-*a* and sense capacitor voltage 530-*b* may be known as the sense window 535. Sense window 535 may be larger here than other sensing schemes due to a larger fraction of the stored charge extracted based on virtually grounding the digit line. The stored logic state may be determined by comparing sense capacitor voltage 530-*a* or 530-*b* to a reference voltage. For example, the reference voltage may be a value between sense capacitor voltage 530-*a* and 530-*b*.

Figure 6:
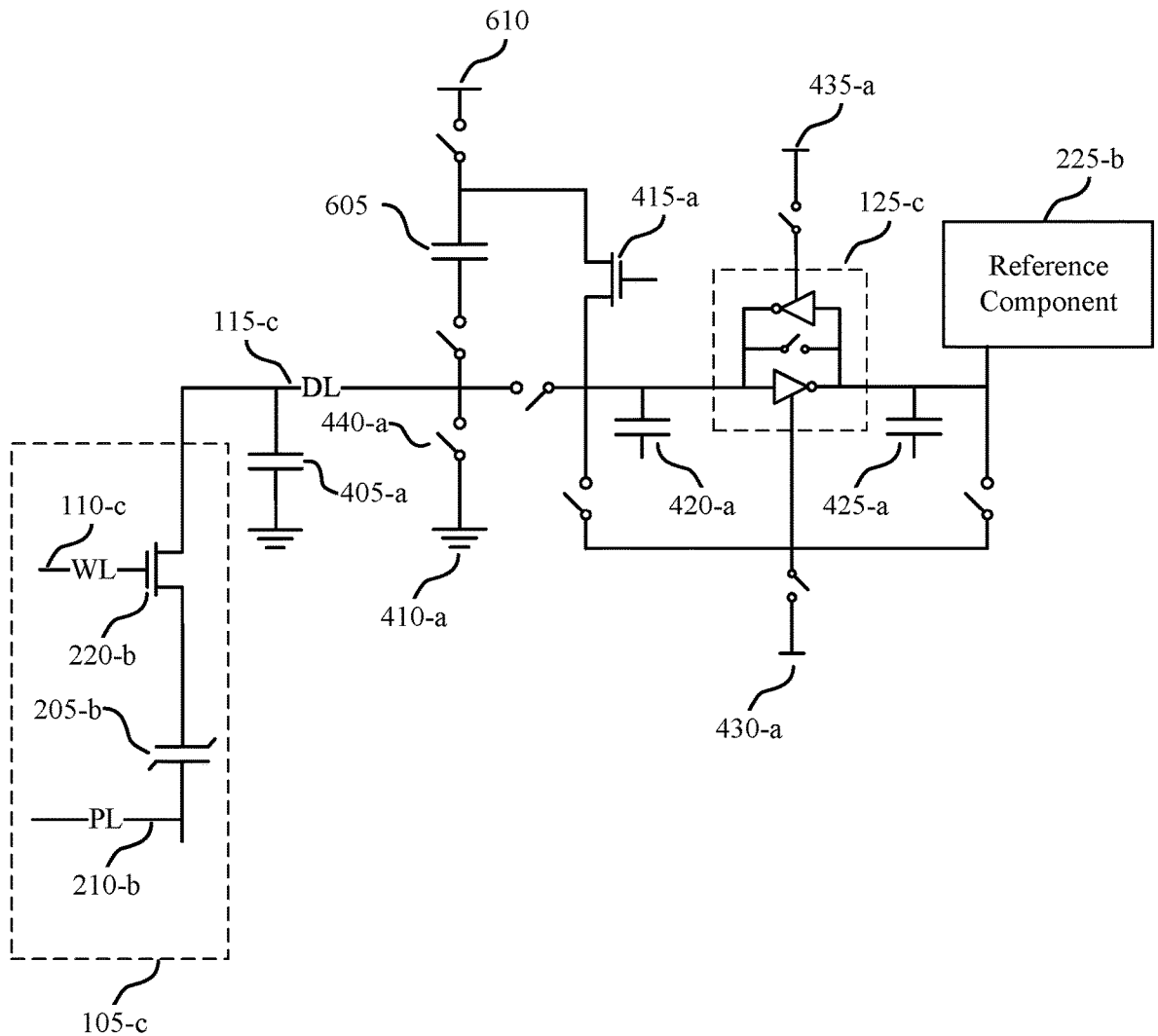
FIG. 6 illustrates an example circuit that supports charge extraction from ferroelectric memory cells in accordance with various embodiments of the present disclosure.

FIG. 6 illustrates an example circuit 600 that supports charge extraction from ferroelectric memory cells in accordance with various embodiments of the present disclosure. Circuit 600 may include memory cell 105-*c*, word line 110-*c*, digit line 115-*c*, and sense component 125-*c*, which may be examples of a memory cell 105, word line 110, digit line 115, and sense component 125, respectively, as described with reference to FIGS. 1, 2, 4, and 5. Circuit 600 may also include capacitor 205-*b*, plate 210-*b*, and reference component 225-*b*, which may be examples of capacitor 205, plate 210, and reference component 225, respectively, as described with reference to FIGS. 2 and 4.

Additionally, circuit 600 may include intrinsic digit line capacitance 405-*a*, virtual ground 410-*a*, switching component 415-*a*, sense capacitor 420-*a*, reference capacitor 425-*a*, voltage source 430-*a*, voltage source 435-*a*, and switch 440-*a*, which may be examples of intrinsic digit line capacitance 405, virtual ground 410, switching component 415, sense capacitor 420, reference capacitor 425, voltage source 430, voltage source 435, and switch 440, respectively, as described with reference to FIG. 4. Circuit 600 may also include a capacitor 605 and a voltage source 610, which may eliminate the need for a negative voltage to activate switching component 415-*a*. In some cases, switching component 415-*a* may virtually ground digit line 115-*c*, enabling full charge transfer from capacitor 205-*b* to sense capacitor 420-*a* during memory cell 105-*c* sensing.

Digit line 115-c may have an intrinsic capacitance, which is represented by intrinsic digit line capacitance 405-a. As discussed above, intrinsic digit line capacitance 405-a may not be an electrical device, rather intrinsic digit line capacitance 405-a may depend on physical characteristics, including the dimensions, of digit line 115-c. The capacitance of sense capacitor 420-a may be greater than intrinsic digit line capacitance 405-a, which may facilitate charge transfer to sense capacitor 420-a.

Virtual ground 410-a may provide a virtual ground to digit line 115-c through switch 440-a. For example, virtual ground 410-a may be in electronic communication with digit line 115-c through switch 440-a. In some cases, switch 440-a may be a transistor. In some cases, digit line 115-c may be virtually grounded before a sensing operation of memory cell 105-c begins. Switch 440-a may then be deactivated to isolate digit line 115-c from virtual ground 410-a.

Switching component 415-a may be a transistor connected in parallel to capacitor 605. In some cases, the transistor comprises a p-type FET. Switching component 415-a may be in electronic communication with digit line 115-c at a point between selection component 220-b and sense capacitor 420-a. Capacitor 605 may be operated in order to activate switching component 415-a, which may virtually ground digit line 115-c.

Sense capacitor 420-a and reference capacitor 425-a may be capacitors configured to store charge when memory cell 105-c is sensed. In some cases, sense capacitor 420-a and reference capacitor 425-a may have the same capacitance. Reference capacitor 425-a may be in electronic communication with reference component 225-b. In some cases, reference component 225-b is one or more ferroelectric memory cells 105. Reference component 225-b may be configured to generate or produce a reference signal. In some cases, charge produced by reference component 225-b may be stored on reference capacitor 425-a.

Sense component 125-c may determine the stored state of memory cell 105-c. In some cases, sense component 125-c may be a sense amplifier. In some cases, sense component 125-c may be in electronic communication with selection component 220-b through digit line 115-c. Sense component 125-c may be operated by voltage source 430-a and voltage source 435-a.

Ferroelectric memory cell 105-c is in electronic communication with digit line 115-c. Switching component 415-a, which is also in electronic communication with digit line 115-c, may be activated to virtually ground digit line 115-c. In some examples, switching component 415-a may be a p-type FET. Activating switching component 415-a to virtually ground digit line 115-c may include applying a charging voltage to capacitor 605 using voltage source 610, electrically isolating a first terminal of capacitor 605 from the charging voltage, and electrically isolating a second terminal of capacitor 605 from virtual ground 410-a. In some cases, the applied charging voltage is a positive voltage and its magnitude may be approximately equal to or greater than the threshold voltage of switching component 415-a. By charging capacitor 605 and then isolating it from voltage source 610 and digit line 115-c, the capacitor may maintain one terminal of switching component 415-a at a positive voltage. In some cases, the other terminal of the switching component 415-a may be initially grounded, and the switching component 415-a may be activated.

Ferroelectric memory cell 105-c may be selected using a selection component 220-b that is in electronic communication with ferroelectric capacitor 205-b, where ferroelectric memory cell 105-c includes the selection component 220-b and ferroelectric capacitor 205-b. For example, selection component 220-b may a transistor (e.g., FET) and may be activated by a voltage applied to a gate of a transistor using word line 110-c.

When switching component 415-a is activated, a voltage may be applied to ferroelectric capacitor 205-b based on selecting ferroelectric memory cell 105-c. For example, a voltage may be applied using plate 210-b. This may result in charging sense capacitor 420-a that is in electronic communication with ferroelectric memory cell 105-c while digit line 115-c is virtually grounded. Sense capacitor 420-a may be discharged initially. In some cases, the charging is based on a voltage applied to ferroelectric capacitor 205-b of memory cell 105-c, which may result in transferring a stored charge of ferroelectric memory cell 105-c to sense capacitor 420-a.

A voltage of sense capacitor 420-a may be compared to a reference voltage. In some cases, comparing the voltage of sense capacitor 420-a to the reference voltage includes activating sense component 125-c that is in electronic communication with sense capacitor 420-a. The reference voltage may result from charging reference capacitor 425-a that is in electronic communication with sense component 125-c, and sense component 125-c may compare the voltage of sense capacitor 420-a to the voltage of reference capacitor 425-a.

Figure 7:
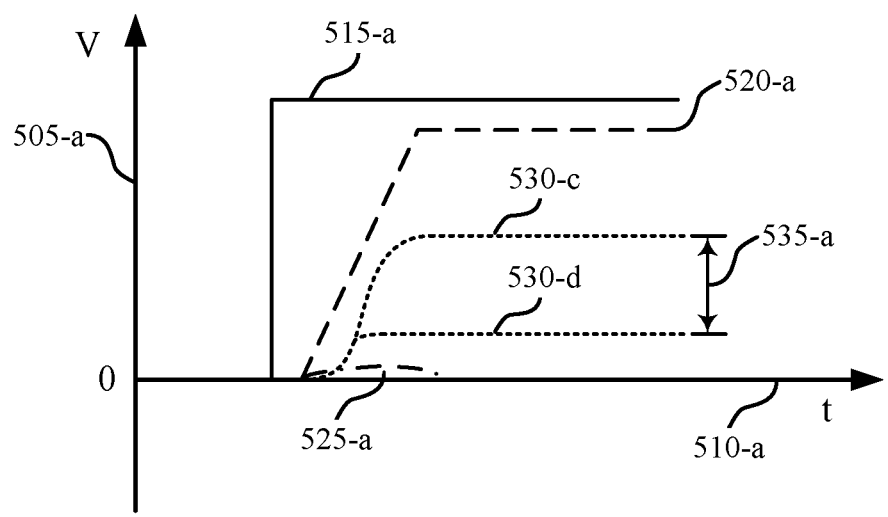
FIG. 7 illustrates a timing diagram for operating a ferroelectric memory cell that supports charge extraction in accordance with various embodiments of the present disclosure.

FIG. 7 illustrates an timing diagram 700 for operating a ferroelectric memory cell that supports charge extraction in accordance with various embodiments of the present disclosure. Timing diagram 700 depicts voltage on axis 505-a and time on axis 510-a. The voltage of various components as a function of time may be represented on timing diagram 700. For example, timing diagram 700 may include word line voltage 515-a, plate voltage 520-a, digit line voltage 525-a, and sense capacitor voltage 530-c and 530-d, which may be examples of word line voltage 515, plate voltage 520, digit line voltage 525, and sense capacitor voltage 530 as described with reference to FIG. 5. Timing diagram 700 may result from operating circuit 600 described with reference to FIG. 6. FIG. 7 is described below with reference to components of preceding figures.

As discussed in FIG. 6, the sense capacitor may be initially discharged (zero voltage). A word line 110 associated with a ferroelectric memory cell 105 may be activated by applying word line voltage 515-a. Plate voltage 520-a may be applied to a plate 210 of a ferroelectric memory cell 105. Digit line voltage 525-a may be approximately zero, or virtually grounded, during sensing as discussed previously. For example, a switching component 415 may virtually ground the digit line during sensing. In some cases, the digit line voltage 525-a may deviate slightly from zero.

With digit line voltage 525-a maintained at ground while word line voltage 515-a and plate voltage 520-a are applied, charge may transfer to a sense capacitor 420, resulting in a change in sense capacitor voltage 530. For example, sense capacitor voltage 530 may increase. The change in sense capacitor voltage 530 may depend on the stored state of the memory cell 105. For example, if a logic 0 is stored, sense capacitor voltage 530 may change to sense capacitor voltage 530-c. If a logic 1 is stored, sense capacitor voltage 530 may change to sense capacitor voltage 530-d. The difference between sense capacitor voltage 530-c and sense capacitor voltage 530-d may be known as the sense window 535-a. Sense window 535-a may be larger here than other sensing schemes due to a larger fraction of the stored charge extracted based on virtually grounding the digit line. The stored logic state may be determined by comparing sense capacitor voltage 530-c or 530-d to a reference voltage. For example, the reference voltage may be a value between sense capacitor voltage 530-c and 530-d.

Figure 8:
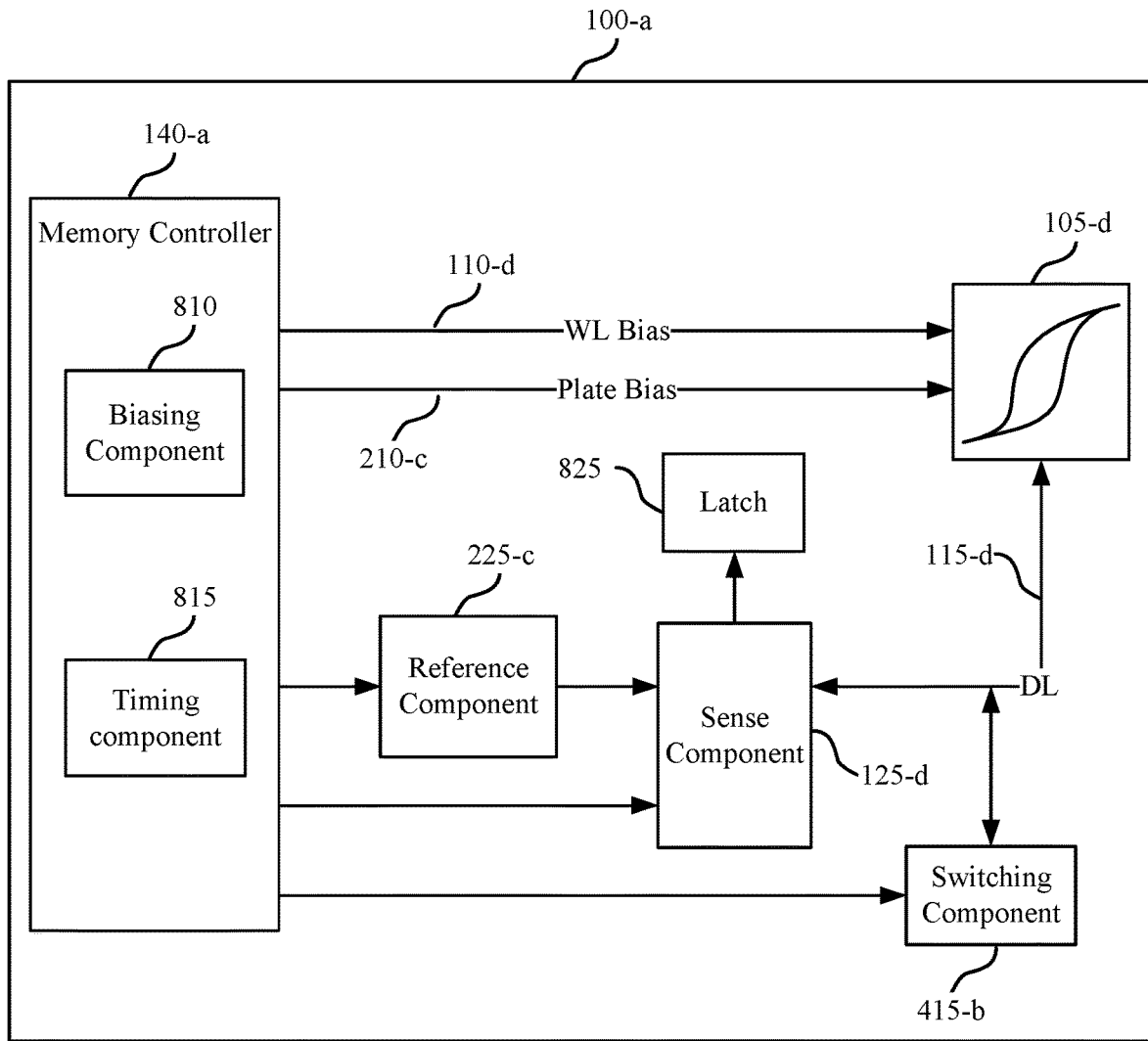
FIG. 8 illustrates a memory array that supports charge extraction from ferroelectric memory cells in accordance with various embodiments of the present disclosure.

FIG. 8 shows a block diagram 800 of a memory array 100-a that supports charge extraction from ferroelectric memory cells in accordance with various embodiments of the present disclosure. Memory array 100-a may be referred to as an electronic memory apparatus and may include memory controller 140-a and memory cell 105-d, which may be examples of memory controller 140 and memory cell 105 described with reference to FIGS. 1, 2, 4, and 6. Memory controller 140-a may include biasing component 810 and timing component 815 and may operate memory array 100-a as described in FIGS. 1-7. Memory controller 140-a may be in electronic communication with word line 110-d, digit line 115-d, sense component 125-d, plate 210-c, reference component 225-c, and switching component 415-b which may be examples of word line 110, digit line 115, sense component 125, plate 210, reference component 225, and switching component 415 described with reference to FIGS. 1, 2, and 4-7. In some examples, switching component 415-b may be in electronic communication with digit line 115-d, as discussed above. Memory array 100-a may also include latch 825. The components of memory array 100-a may be in electronic communication with one another and may perform the functions described with reference to FIGS. 1-7. In some cases, reference component 225-c, sense component 125-d and latch 825 may be components of memory controller 140-a.

Memory controller 140-a may be configured to activate word line 110-d, sense component 125-d, plate 210-c, reference component 225-c, or switching component 415-b by applying voltages to those various nodes. For example, biasing component 810 may be configured to apply a voltage to operate memory cell 105-d to read or write memory cell 105-d as described above. In some cases, memory controller 140-a may include a row decoder, column decoder, or both, as described with reference to FIG. 1. This may enable memory controller 140-a to access one or more memory cells 105. Biasing component 810 may also provide voltage to reference component 225-c in order to generate a reference signal for sense component 125-d. Additionally, biasing component 810 may provide voltage for the operation of sense component 125-d.

Memory controller 140-a may activate a switching component 415, for example, by applying a voltage to a gate of a transistor of switching component 415. Thus, memory controller 140-a may operate switching component 415-b to virtually ground digit line 115-d and activate sense component 125-d based on virtually grounding digit line 115-d. Memory controller 140-a may operate the ferroelectric capacitor of ferroelectric memory cell 105-d to charge a sense capacitor based on selecting ferroelectric memory cell 105-d. Additionally, memory controller 140-a may compare a voltage of the sense capacitor to a voltage of the reference capacitor to read a logic value of ferroelectric memory cell 105-d.

In some cases, memory controller 140-a may perform its operations using timing component 815. For example, timing component 815 may control the timing for biasing the various word lines, digit lines, or plates, including timing for switching and voltage application to perform the memory functions, such as reading and writing, as discussed herein. In some cases, timing component 815 may control the operations of biasing component 810.

Reference component 225-c may generate a reference signal for sense component 125-d. Reference component 225-c may, for example, include circuitry configured to produce a reference signal. In some cases, reference component 225-c is other ferroelectric memory cells 105. In some examples, reference component 225-c is configured to output a voltage with a value between the two sense voltages, as described with reference to FIGS. 3, 5, and 7. Or reference component 225-c may be designed to output a virtual ground voltage (i.e., approximately 0V).

Sense component 125-d may compare a signal from memory cell 105-d (through digit line 115-d) with a reference signal from reference component 225-c. Upon determining the logic state, the sense component may then store the output in latch 825, where it may be used in accordance with the operations of an electronic device using memory array 100-a.

Figure 9:
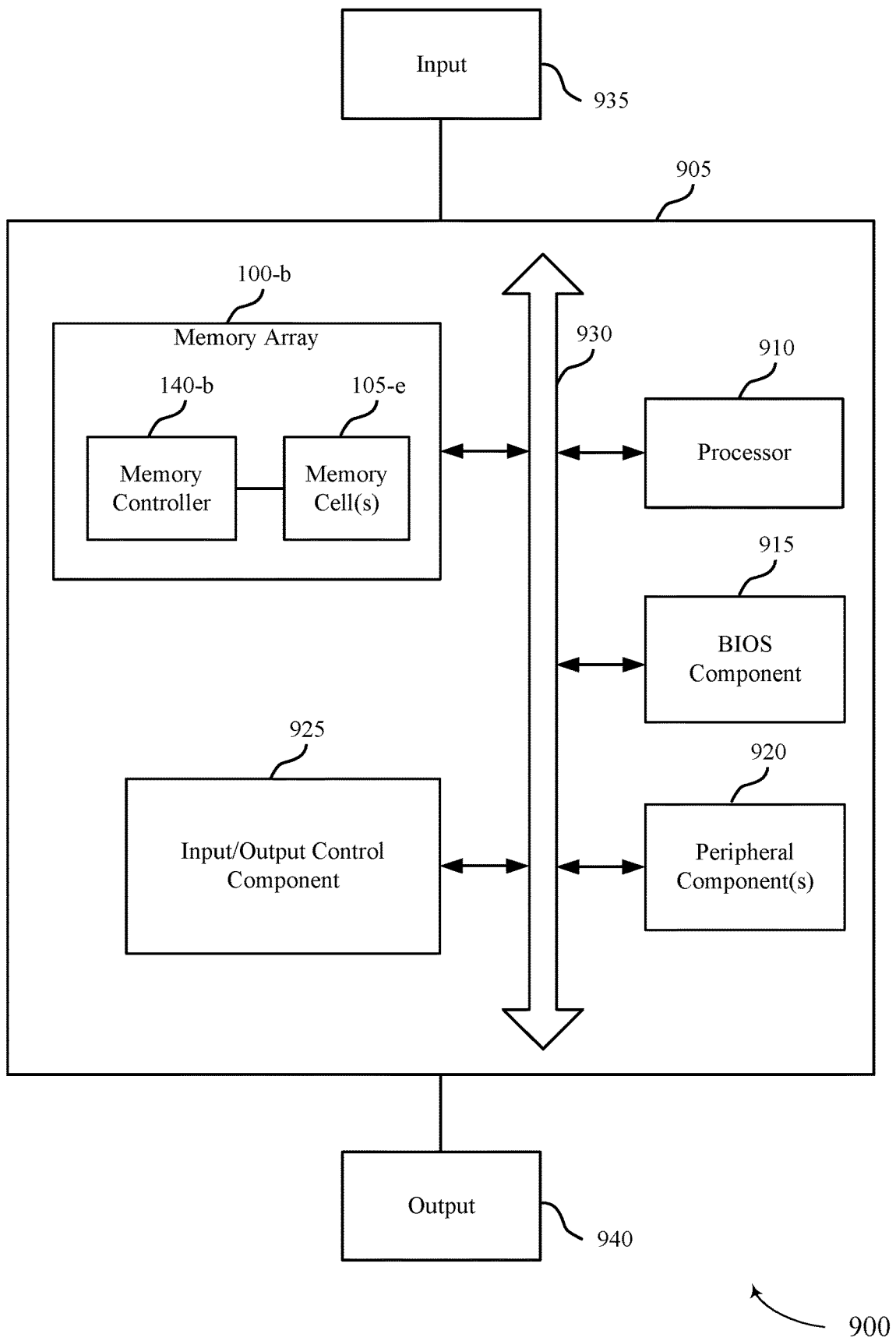
FIG. 9 illustrates a system, including a memory array, that supports charge extraction from ferroelectric memory cells in accordance with various embodiments of the present disclosure.

FIG. 9 shows a diagram of a system 900 that supports charge extraction from ferroelectric memory cells in accordance with various embodiments of the present disclosure. System 900 may include a device 905, which may be or include a printed circuit board to connect or physically support various components. Device 905 may include a memory array 100-b, which may be an example of memory array 100 described in FIG. 1 and FIG. 8. Memory array 100-b may contain memory controller 140-b and memory cell(s) 105-e, which may be examples of memory controller 140 described with reference to FIGS. 1 and 8 and memory cells 105 described with reference to FIGS. 1, 2, 4, 6, and 8. Device 905 may also include a processor 910, BIOS component 915, peripheral component(s) 920, and input/output control component 925. The components of device 905 may be in electronic communication with one another through bus 930.

Processor 910 may be configured to operate memory array 100-b through memory controller 140-b. In some cases, processor 910 performs the functions of memory controller 140 described with reference to FIGS. 1 and 8. For example, memory controller 140-b may activate a switching component to virtually ground a digit line 115 while reading a memory cell 105-e in order to extract fully the stored charge. In some cases, memory controller 140-b may be integrated into processor 910. Processor 910 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 910 may perform various functions described herein, including charge extraction from ferroelectric memory cells. Processor 910 may, for example, be configured to execute computer-readable instructions stored in memory array 100-a to cause device 905 perform various functions or tasks.

BIOS component 915 may be a software component that includes a basic input/output system (BIOS) operated as firmware, which may initialize and run various hardware components of system 900. BIOS component 915 may also manage data flow between processor 910 and the various components, e.g., peripheral components 920, input/output control component 925, etc. BIOS component 915 may include a program or software stored in read-only memory (ROM), flash memory, or any other non-volatile memory.

Peripheral component(s) 920 may be any input or output device, or an interface for such devices, that is integrated into device 905. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 925 may manage data communication between processor 910 and peripheral component(s) 920, input 935 devices, or output 940 devices. Input/output control component 925 may also manage peripherals not integrated into device 905. In some cases, input/output control component 925 may represent a physical connection or port to the external peripheral.

Input 935 may represent a device or signal external to device 905 that provides input to device 905 or its components. This may include a user interface or interface with or between other devices. In some cases, input 935 may be a peripheral that interfaces with device 905 via peripheral component(s) 920 or may be managed by input/output control component 925.

Output 940 device may represent a device or signal external to device 905 configured to receive output from device 905 or any of its components. Examples of output 940 device may include a display, audio speakers, a printing device, another processor or printed circuit board, etc. In some cases, output 940 may be a peripheral that interfaces with device 905 via peripheral component(s) 920 or may be managed by input/output control component 925.

The components of memory controller 140-b, device 905, and memory array 100-b may be made up of circuitry designed to carry out their functions. This may include various circuit elements, for example, conductive lines, transistors, capacitors, inductors, resistors, amplifiers, or other active or inactive elements, configured to carry out the functions described herein.

Figure 10:
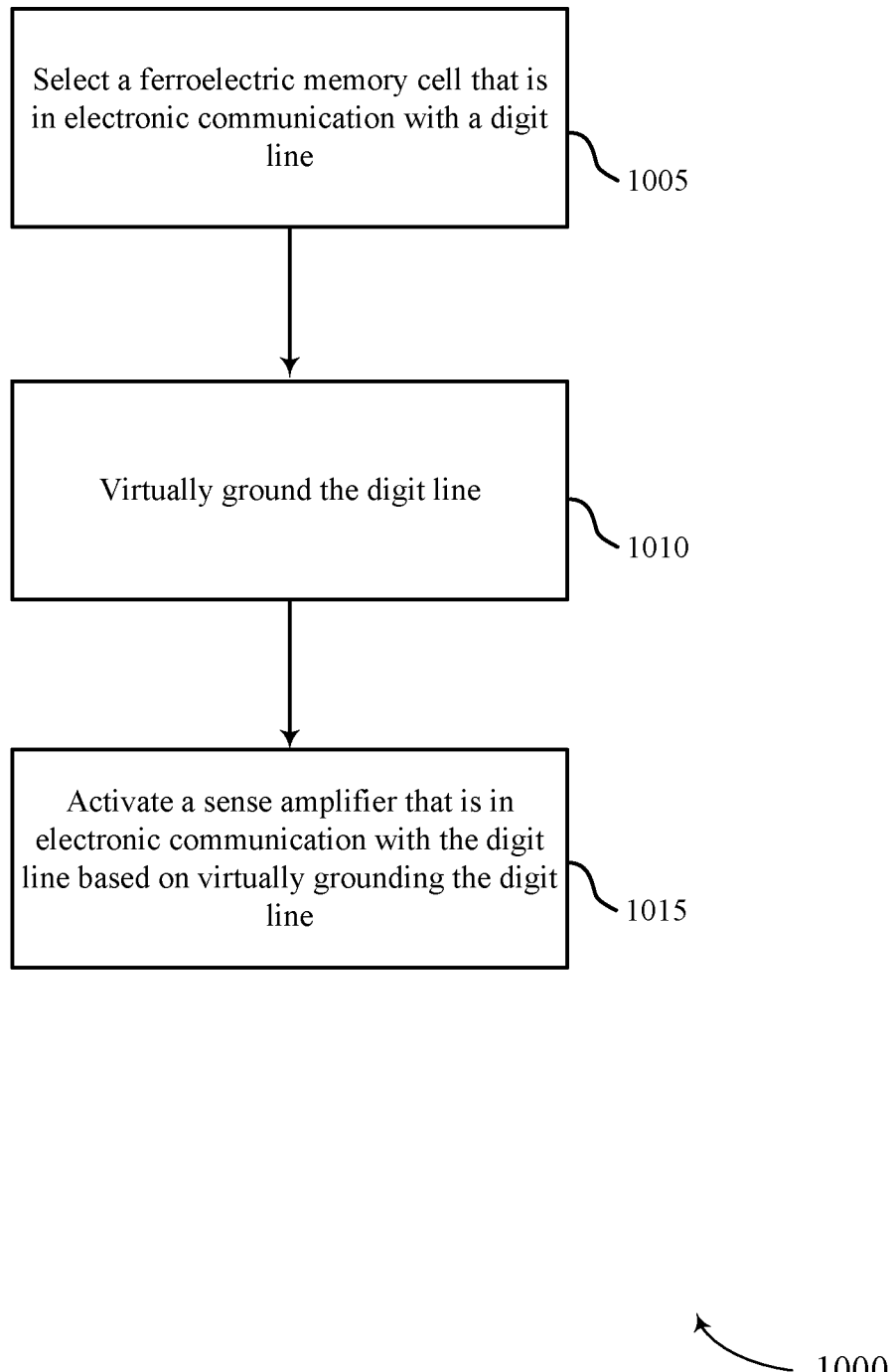
FIGS. 10 and 11 are flowcharts that illustrate methods of operating a ferroelectric memory cell for charge extraction in accordance with various embodiments of the present disclosure.

FIG. 10 shows a flowchart illustrating a method 1000 of operating a ferroelectric memory cell for charge extraction in accordance with various embodiments of the present disclosure. The operations of method 1000 may be implemented by a memory array 100 as described with reference to FIGS. 1-9. For example, the operations of method 1000 may be performed by a memory controller 140 as described with reference to FIGS. 1, 8, and 9. In some examples, a memory controller 140 may execute a set of codes to control the functional elements of the memory array 100 to perform the functions described below. Additionally or alternatively, the memory controller 140 may perform the functions described below using special-purpose hardware.

At block 1005, the method may include selecting a ferroelectric memory cell that is in electronic communication with a digit line, as described with reference to FIGS. 1-7. In certain examples, the operations of block 1005 may be performed by the memory controller 140, as described with reference to FIGS. 1, 8, and 9.

At block 1010, the method may include virtually grounding the digit line, as described with reference to FIGS. 1-7. In certain examples, the operations of block 1010 may be performed by the switching component 415, as described with reference to FIGS. 4, 6, and 8. For example, virtually grounding the digit line may comprise activating a switching component that is in electronic communication between the digit line and the sense amplifier.

At block 1015, the method may include activating a sense amplifier that is in electronic communication with the digit line based on virtually grounding the digit line, as described with reference to FIGS. 1-7. In some cases, the sense amplifier may be activated while the digit line is virtually grounded. In certain examples, the operations of block 1015 may be performed by the sense component 125, as described with reference to FIGS. 1, 2, 4, 6, and 8.

The method may also include applying a voltage to a ferroelectric capacitor of the ferroelectric memory cell. For example, the memory controller 140 may control a voltage source to apply a plate voltage to the ferroelectric capacitor, as described with reference to FIGS. 1, 8, and 9. In some examples, the method includes charging a sense capacitor that is in electronic communication with the digit line based at least in part on applying the voltage to the ferroelectric capacitor while the digit line is grounded. For example, the memory controller 140 may control a voltage source, which may be a negative voltage source, to apply a voltage to the sense capacitor, as described with reference to FIGS. 1, 4, 6, 8, and 9. The method may also include comparing a voltage of the sense capacitor to a reference voltage based at least in part on activating the sense amplifier. In certain examples, this may be performed by the sense component 125, as described with reference to FIGS. 1, 2, 4, 6, and 8.

Figure 11:
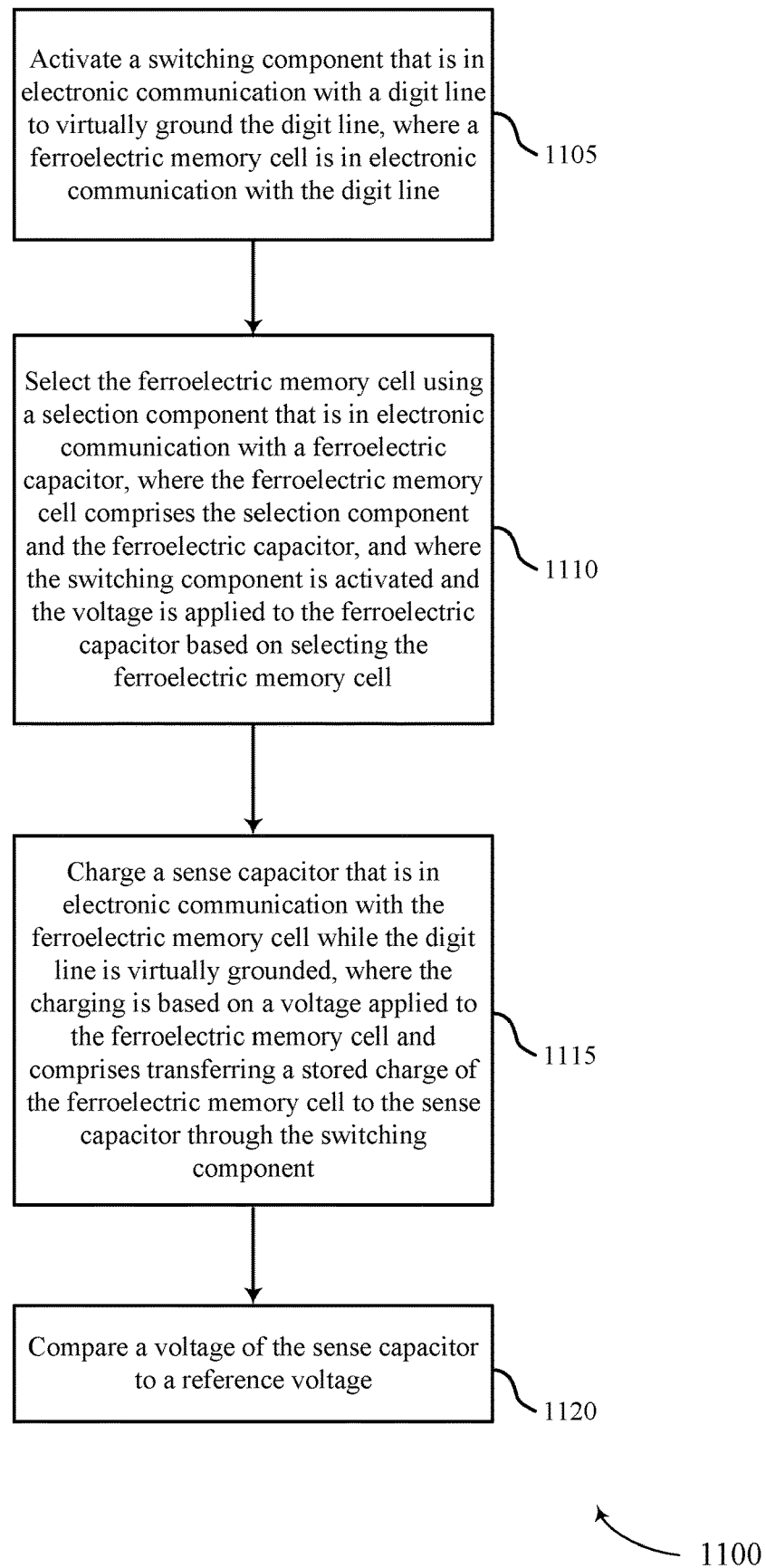

FIG. 11 shows a flowchart illustrating a method 1100 of operating a ferroelectric memory cell for charge extraction in accordance with various embodiments of the present disclosure. The operations of method 1100 may be implemented by a memory array 100 as described with reference to FIGS. 1-9. For example, the operations of method 1100 may be performed by a memory controller 140 as described with reference to FIGS. 1, 8, and 9. In some examples, a memory controller 140 may execute a set of codes to control the functional elements of the memory array 100 to perform the functions described below. Additionally or alternatively, the memory controller 140 may perform the functions described below using special-purpose hardware.

At block 1105, the method may include activating a switching component that is in electronic communication with a digit line to virtually ground the digit line, where a ferroelectric memory cell is in electronic communication with the digit line as described with reference to FIGS. 1-7. In certain examples, the operations of block 1105 may be performed by the memory controller 140 as described with reference to FIGS. 1, 8, and 9.

At block 1110, the method may include selecting the ferroelectric memory cell using a selection component that is in electronic communication with a ferroelectric capacitor, where the ferroelectric memory cell comprises the selection component and the ferroelectric capacitor, and where the switching component is activated and the voltage is applied to the ferroelectric capacitor based on selecting the ferroelectric memory cell as described with reference to FIGS. 1-7. In certain examples, the operations of block 1110 may be performed by the memory controller 140 as described with reference to FIGS. 1, 8, and 9.

At block 1115, the method may include charging a sense capacitor that is in electronic communication with the ferroelectric memory cell while the digit line is virtually grounded, where the charging is based on a voltage applied to the ferroelectric memory cell and comprises transferring a stored charge of the ferroelectric memory cell to the sense capacitor through the switching component as described with reference to FIGS. 1-7. In certain examples, the operations of block 1115 may be performed by the memory controller 140, the switching component 415, and the sense capacitor 420 as described with reference to FIGS. 1-9

At block 1120, the method may include comparing a voltage of the sense capacitor to a reference voltage as described with reference to FIGS. 1-7. In certain examples, the operations of block 1120 may be performed by the sense component 125 as described with reference to FIGS. 1, 2, 4, 6, and 8.

The method may further include applying a charging voltage to the sense capacitor while the switching component is inactive and then electrically isolating the sense capacitor from the charging voltage. For example, the memory controller 140 may apply a negative charging voltage to the sense capacitor. In some cases, the switching component may include a transistor connected in series with the sense capacitor, and the method may include applying a voltage to the gate of the transistor to activate the switching component and virtually ground the digit line, as described with reference to FIGS. 4, 6, and 8.

In some cases, the switching component may include a transistor connected in parallel to a capacitor and to activate the switching component, the method may include applying a charging voltage to the capacitor, electrically isolating a first terminal of the capacitor from the charging voltage, and electrically isolating a second terminal of the capacitor from virtual ground, as described with reference to FIG. 6. In some cases, the memory controller 140 may apply a positive charging voltage to the capacitor.

Thus, methods 1000 and 1100 may provide for charge extraction from ferroelectric memory cells. It should be noted that methods 1000 and 1100 describe possible implementations, and the operations and steps may be rearranged or otherwise modified such that other implementations are possible. In some examples, embodiments from two or more of the methods 1000 and 1100 may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example" and "exemplary," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that may not be directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method of operating a memory cell, comprising:
   activating a switching component that is in electronic communication with a digit line, the switching component being separate from the memory cell, wherein the memory cell comprises a ferroelectric capacitor and a selection component, and wherein the switching component is activated by a capacitor that is electrically positioned between the switching component and the digit line;
   virtually grounding the digit line based at least in part on activating the switching component; and
   activating a sense amplifier based at least in part on virtually grounding the digit line.

2. The method of claim 1, further comprising:
   selecting the memory cell that is in electronic communication with the digit line; and
   charging a sense capacitor that is in electronic communication with the memory cell while the digit line is virtually grounded based at least in part on selecting the memory cell.

3. The method of claim 2, further comprising:
   comparing a voltage of the sense capacitor to a reference voltage based at least in part on activating the sense amplifier; and
   determining a logic state of the memory cell based at least in part on comparing the voltage of the sense capacitor to the reference voltage.

4. The method of claim 2, wherein charging the sense capacitor is based at least in part on a voltage applied to the ferroelectric capacitor of the memory cell.

5. The method of claim 2, further comprising:
   transferring a stored charge of the memory cell to the sense capacitor via the switching component based at least in part on virtually grounding the digit line; and
   reading the memory cell based at least in part on transferring the stored charge.

6. The method of claim 2, wherein activating the switching component comprises:
   applying a voltage to the sense capacitor when the switching component is electrically positioned between the sense capacitor and the digit line.

7. The method of claim 1, wherein activating the switching component comprises:
   applying a voltage to the capacitor when the switching component and the capacitor are connected in parallel.

8. The method of claim 1, wherein the sense amplifier is in electronic communication with the digit line.

9. An electronic memory apparatus, comprising:
   a memory cell in electronic communication with a digit line, the memory cell comprising a ferroelectric capacitor and a selection component;
   a sense capacitor in electronic communication with the digit line via a switching component, the switching component being separate from the memory cell and configured to virtually ground the digit line when activated by a capacitor that is electrically positioned between the switching component and the digit line; and
   a sense amplifier connected with the sense capacitor, the sense capacitor being electrically positioned between the switching component and the sense amplifier.

10. The electronic memory apparatus of claim 9, wherein the memory cell comprises the selection component in electronic communication with the digit line.

11. The electronic memory apparatus of claim 9, wherein the switching component is configured to isolate the digit line from virtual ground when the switching component is deactivated.

12. The electronic memory apparatus of claim 9, further comprising:
the capacitor connected in parallel with the switching component.

13. The electronic memory apparatus of claim 9, wherein the switching component is electrically positioned between the sense capacitor and the selection component of the memory cell via the digit line.

14. An electronic memory apparatus, comprising:
a memory cell that comprises a selection component;
a sense amplifier in electronic communication with the selection component; and
a controller in electronic communication with the sense amplifier, wherein the controller is operable to:
apply a positive charging voltage or a negative charging voltage to a capacitor to virtually ground a digit line, the capacitor being electrically positioned between a switching component and the digit line, wherein the positive charging voltage or the negative charging voltage applied to the capacitor activates the switching component to virtually ground the digit line; and
activate the sense amplifier based at least in part on virtually grounding the digit line.

15. The electronic memory apparatus of claim 14, wherein the controller is operable to:
operate the switching component based at least in part on applying the positive charging voltage or the negative charging voltage to the capacitor.

16. The electronic memory apparatus of claim 15, wherein applying the positive charging voltage or the negative charging voltage to the capacitor occurs when the switching component and the capacitor are connected in parallel.

17. The electronic memory apparatus of claim 15, wherein the switching component is connected with a sense capacitor and the selection component via the digit line.

18. The electronic memory apparatus of claim 14, wherein the controller is operable to:
compare a voltage of a sense capacitor to a reference voltage based at least in part on activating the sense amplifier.

19. The electronic memory apparatus of claim 18, wherein the controller is operable to:
determine a logic state of the memory cell based at least in part on comparing the voltage of the sense capacitor to the reference voltage.

20. The electronic memory apparatus of claim 14, wherein the sense amplifier is in electronic communication with the selection component via the digit line.

* * * * *